United States Patent
Ueno et al.

(10) Patent No.: US 7,727,053 B2
(45) Date of Patent: Jun. 1, 2010

(54) DOUBLE-SIDE POLISHING METHOD FOR WAFER

(75) Inventors: Junichi Ueno, Fukushima (JP); Syuichi Kobayashi, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 26 days.

(21) Appl. No.: 11/988,830

(22) PCT Filed: Jun. 28, 2006

(86) PCT No.: PCT/JP2006/312856

§ 371 (c)(1),
(2), (4) Date: Jan. 15, 2008

(87) PCT Pub. No.: WO2007/010717

PCT Pub. Date: Jan. 25, 2007

(65) Prior Publication Data

US 2009/0124175 A1 May 14, 2009

(30) Foreign Application Priority Data

Jul. 19, 2005 (JP) ............................. 2005-209216

(51) Int. Cl.
*B24B 1/00* (2006.01)
(52) U.S. Cl. .............................. 451/41; 451/262
(58) Field of Classification Search .............. 451/41, 451/262, 268, 269
See application file for complete search history.

(56) References Cited

U.S. PATENT DOCUMENTS

| | | | | |
|---|---|---|---|---|
| 5,595,529 A | * | 1/1997 | Cesna et al. | 451/291 |
| 5,782,678 A | * | 7/1998 | Cesna et al. | 451/291 |
| 5,803,798 A | * | 9/1998 | Cesna et al. | 451/269 |
| 6,045,437 A | * | 4/2000 | Tandon et al. | 451/288 |
| 6,645,862 B2 | * | 11/2003 | Wenski et al. | 438/691 |
| 7,485,029 B2 | * | 2/2009 | Kanda et al. | 451/267 |
| 2006/0178089 A1 | * | 8/2006 | Ueno | 451/262 |
| 2008/0057831 A1 | * | 3/2008 | Kanda et al. | 451/269 |

FOREIGN PATENT DOCUMENTS

| | | |
|---|---|---|
| EP | 1 413 396 A1 | 4/2004 |
| JP | A 08-167585 | 6/1996 |
| JP | A 11-262862 | 9/1999 |
| JP | A 2000-271857 | 10/2000 |
| JP | A 2004-142040 | 5/2004 |

* cited by examiner

OTHER PUBLICATIONS

Oct. 12, 2009 European Office Action for corresponding European application No. 06 767 473.9.

*Primary Examiner*—Maurina Rachuba
(74) *Attorney, Agent, or Firm*—Oliff & Berridge PLC

(57) ABSTRACT

There is provided a double-side polishing method for a wafer of sandwiching a wafer held in a carrier between upper and lower turn tables each having a polishing pad attached thereto and simultaneously polishing both surfaces of the wafer while supplying a slurry to a space between the upper and lower turn tables from a plurality of slurry supply holes provided in the upper turn table, wherein a polishing amount at an outer peripheral portion of the wafer to be polished is adjusted and outer peripheral sag of the wafer is suppressed by supplying the slurry in such a manner that an amount of the slurry supplied from the slurry supply holes provided on an outer side relative to the center of rotation of the upper turn table becomes larger than an amount of the slurry supplied from the slurry supply holes provided on an inner side relative to the same at the time of polishing both the surfaces of the wafer. As a result, the double-side polishing method which can suppress occurrence of the outer peripheral sag of the wafer when the wafer is subjected to double-side polishing can be provided.

1 Claim, 7 Drawing Sheets

[Fig. 1]
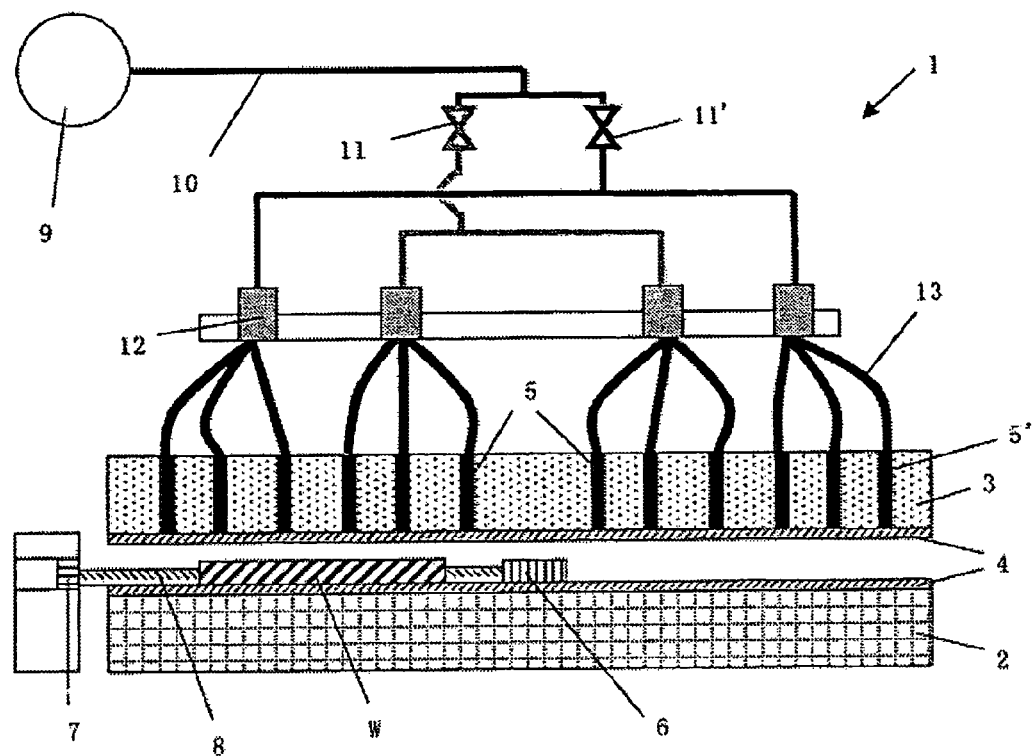

[Fig. 2]
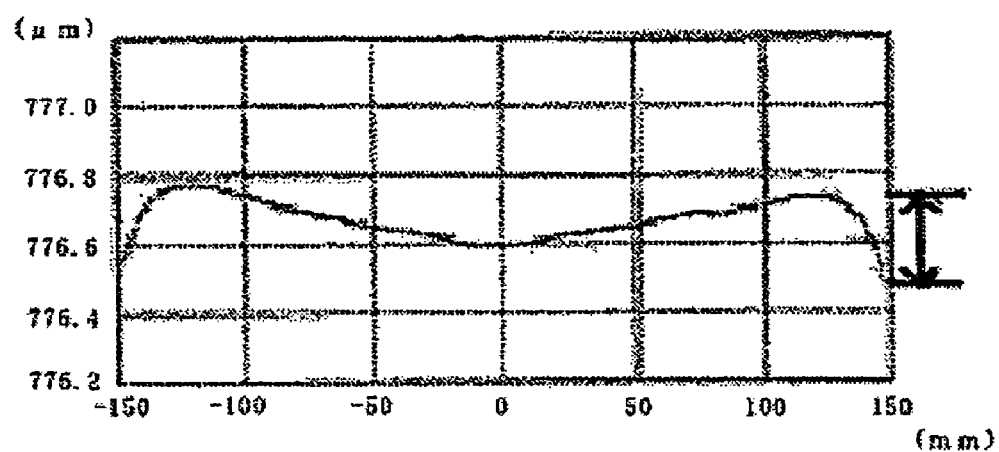
OUTER PERIPHERAL SAG = 0.254 μm

[Fig. 3]
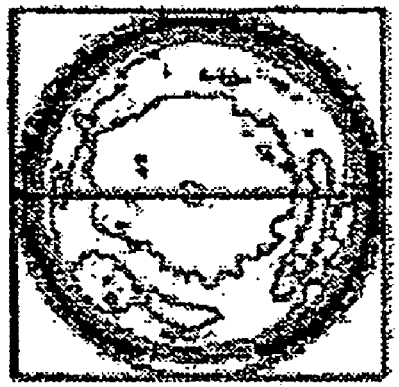
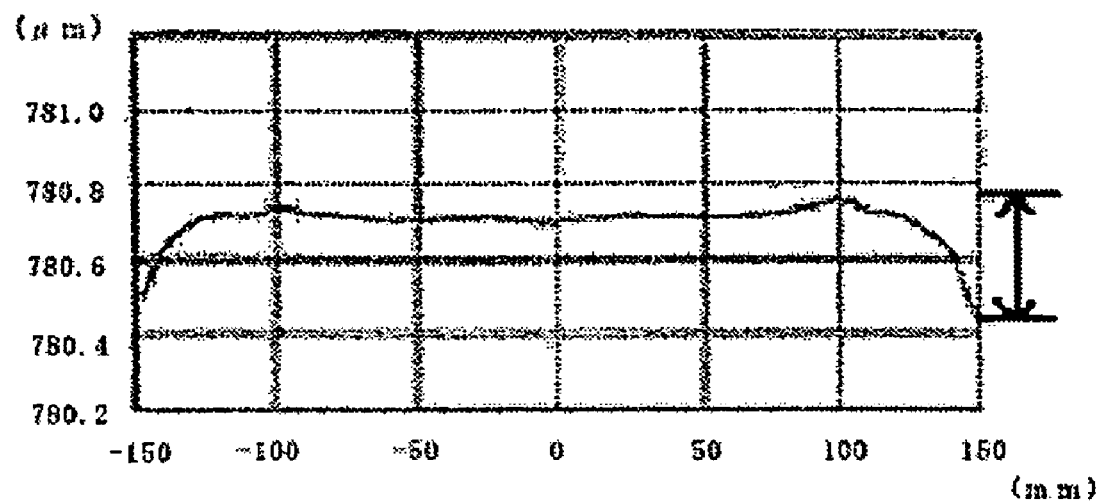
OUTER PERIPHERAL SAG = 0.327 μm

[Fig. 4]
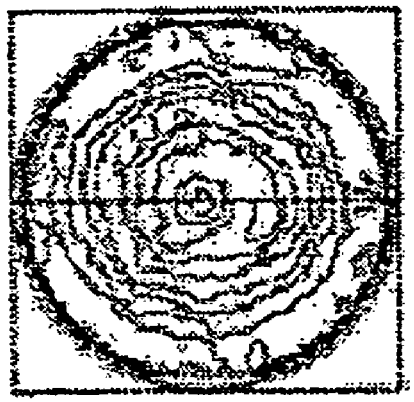
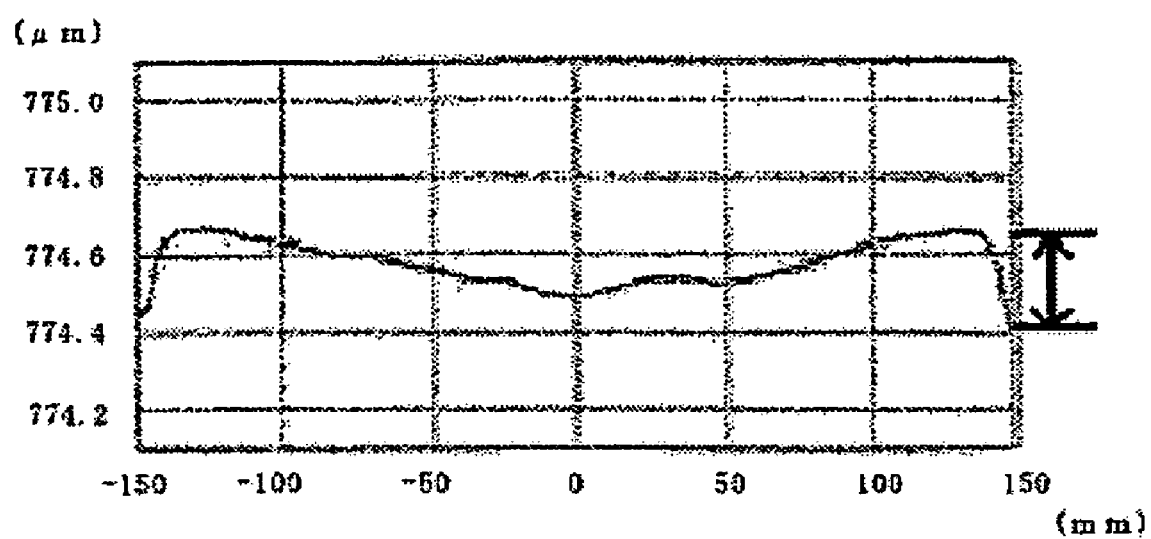
OUTER PERIPHERAL SAG = 0.218 μm

[Fig. 5]
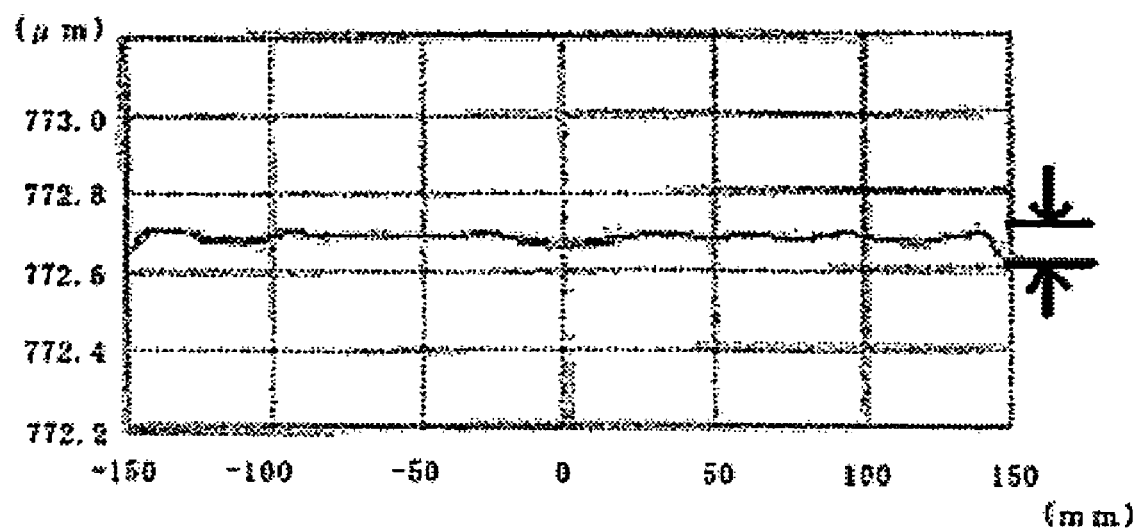
OUTER PERIPHERAL SAG = 0.091 μm

[Fig. 6]
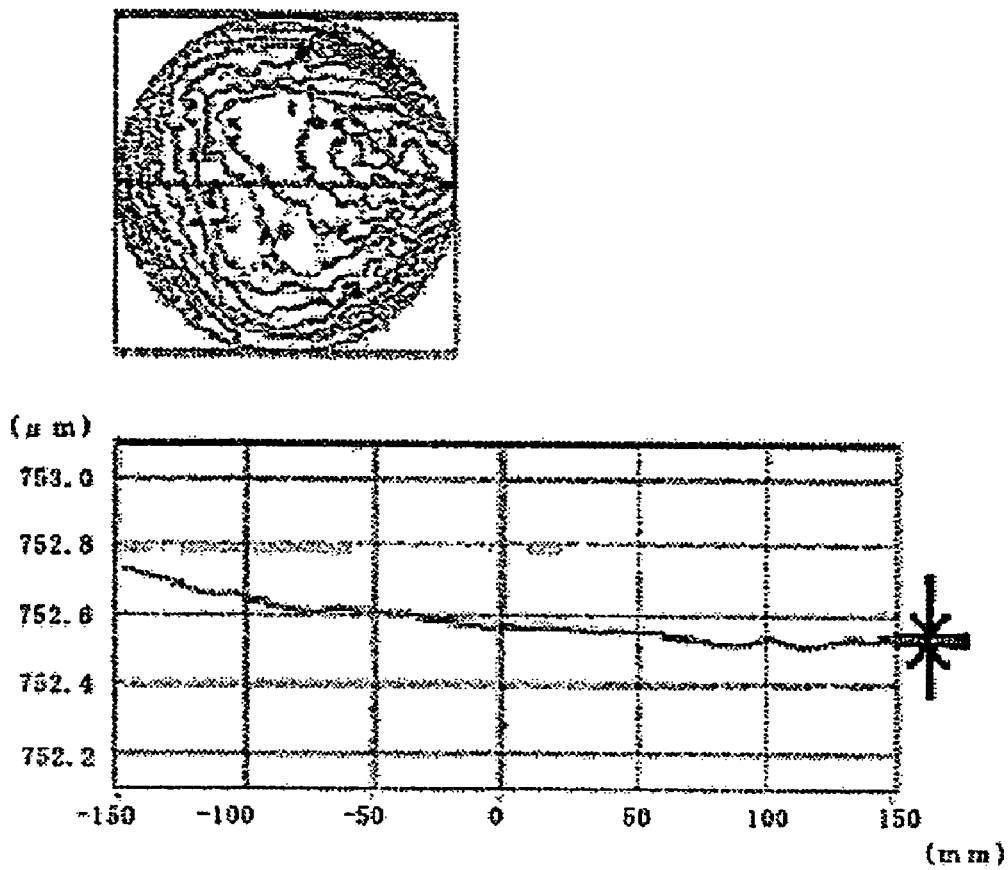
OUTER PERIPHERAL SAG = 0.036 μm
[Fig. 7]
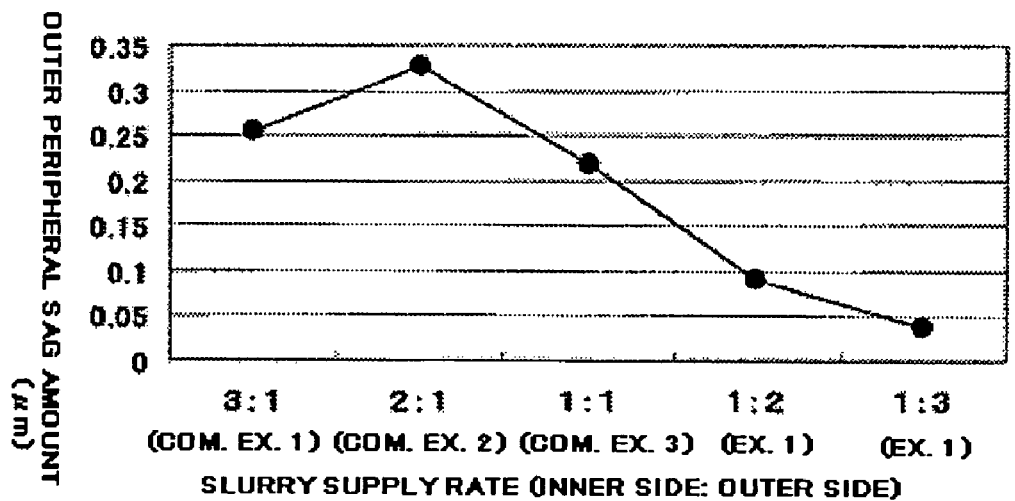

[Fig. 8]
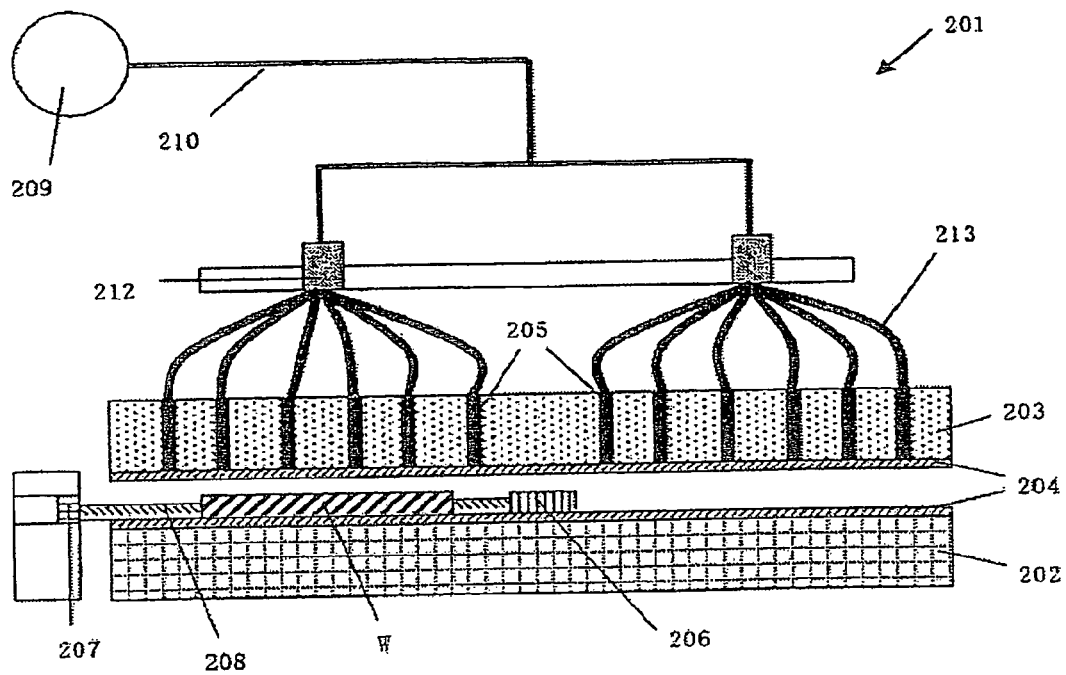
PRIOR ART

DOUBLE-SIDE POLISHING METHOD FOR WAFER

TECHNICAL FIELD

The present invention relates to a method of polishing both surfaces of a wafer, and more particularly to a double-side polishing method which can suppress outer peripheral sag of a wafer by improving a method of supplying a slurry to the wafer.

BACKGROUND ART

FIG. 8 is a schematic explanatory drawing showing an example of a conventional double-side polishing apparatus. As shown in FIG. 8, a double-side polishing apparatus 201 is an apparatus which enables rotation and revolution of a carrier 208 meshed between a sun gear 206 and an internal gear 207 by driving rotation of the sun gear 206 and rotates a lower turn table 202 and an upper turn table 203 in opposite directions to simultaneously polish both surfaces of a wafer W by polishing pads 204 attached to the upper and lower turn tables.

Further, a slurry supplying mechanism that supplies to a wafer W a slurry which increases a polishing efficiency for the wafer W and reduces heat generated in the upper and lower turn tables 202 and 203 is provided in the double-side polishing apparatus 201. This slurry supplying mechanism is a mechanism that supplies a slurry to slurry supply holes 205 provided in the upper turn table 203 from a slurry tank 209 through a slurry supply duct 210, powder rings 212, and slurry supply tubes 213 and allows the slurry to flow out from lower end openings of the slurry supply holes 205 toward the wafer W.

According to a conventional technology, both surfaces of a wafer are polished while uniformly supplying the same amount of slurry from each supply hole by using such a double-side polishing apparatus. Further, Japanese Patent Application Laid-open No. 2004-142040 or Japanese Patent Application Laid-open No. H11-262862 discloses a double-side polishing method using a double-side polishing apparatus having a different structure adopting, e.g., a compression transport scheme in relation to a slurry supply scheme.

However, in the conventional method or the double-sides polishing method disclosed above, when both surfaces of a wafer are polished, sag frequently occurs at an outer peripheral portion of the wafer after polishing, and a shape of a wafer surface is not flat, resulting in a problem of a quality.

DISCLOSURE OF INVENTION

In view of the above-explained problem, it is an object of the present invention to provide a double-side polishing method which can suppress occurrence of outer peripheral sag of a wafer when the processing target wafer is subjected to double-side polishing.

To achieve this object, according to the present invention, there is provided a double-side polishing method for a wafer of sandwiching a wafer held in a carrier between upper and lower turn tables each having a polishing pad attached thereto and simultaneously polishing both surfaces of the wafer while supplying a slurry to a space between the upper and lower turn tables from a plurality of slurry supply holes provided in the upper turn table, wherein a polishing amount at an outer peripheral portion of the wafer to be polished is adjusted and outer peripheral sag of the wafer is suppressed by supplying the slurry in such a manner that an amount of the slurry supplied from the slurry supply holes provided on an outer side relative to the center of rotation of the upper turn table becomes larger than an amount of the slurry supplied from the slurry supply holes provided on an inner side relative to the same at the time of polishing both the surfaces of the wafer.

When polishing both surfaces of a wafer in this manner, by supplying a slurry in such a manner that an amount of the slurry supplied from the slurry supply holes provided on the outer side relative to the center of rotation of the upper turn table becomes larger than an amount of the slurry supplied from the slurry supply holes provided on the inner side relative to the same, a polishing amount at the outer peripheral portion of the wafer to be polished can be adjusted and outer peripheral sag of the wafer can be suppressed. Therefore, double-side polishing can be performed to provide the high-quality wafer in which sag at the outer peripheral portion is suppressed.

In particular, changing a rate of the slurry supply amount on the outer side and that on the inner side enables arbitrarily controlling the polishing amount at the wafer outer peripheral portion.

At this time, it is desirable that the amount of the slurry supplied from the supply holes provided on the outer side of the upper turn table is twice or more of the amount of the slurry supplied from the slurry supply holes provided on the inner side of the same.

When the amount of the slurry supplied from the supply holes provided on the outer side of the upper turn table is twice or more of the amount of the slurry supplied from the slurry supply holes provided on the inner side of the same in this manner, the outer peripheral sag of the wafer can be more assuredly suppressed, thereby providing the high-quality wafer with a high degree of flatness. Further, since the slurry can be supplied from the supply holes on the inner side and the outer side of the upper turn table at a more appropriate rate, productivity of the wafer can be further improved.

According to the double-side polishing method of the present invention, both surfaces of a processing target wafer can be polished to provide a high-quality wafer in which sag at an outer periphery is suppressed. Furthermore, since the slurry can be appropriately adjusted in terms of supply positions and amounts and supplied to a space between the upper and lower turn tables at the time of polishing, sag at the wafer outer peripheral portion can be arbitrarily controlled, thus improving productivity of the wafer.

BRIEF EXPLANATION OF DRAWINGS

FIG. 1 is a schematic explanatory drawing showing an example of a double-side polishing apparatus used in the present invention;

FIG. 2 is a measurement chart of a wafer shape in Comparative Example 1;

FIG. 3 is a measurement chart of a wafer shape in Comparative Example 2;

FIG. 4 is a measurement chart of a wafer shape in Comparative Example 3;

FIG. 5 is a measurement chart of a wafer shape in Example 1;

FIG. 6 is a measurement chart of a wafer shape in Example 2;

FIG. 7 is a graph showing a relationship between a supply rate of a slurry from supply holes on an inner side and an outer side of an upper turn table and an outer peripheral sag amount of a wafer; and FIG. 8 is a schematic explanatory drawing showing an example of a conventional double-side polishing apparatus.

BEST MODES FOR CARRYING OUT THE INVENTION

Although embodiments according to the present invention will now be explained hereinafter, the present invention is not restricted thereto.

When both surfaces of a wafer are polished by a conventional double-side polishing method, there is a problem that sag occurs at an outer peripheral portion of the wafer.

As a result of keen examination about occurrence of sag at an outer peripheral portion of a wafer in double-side polishing, the present inventors have discovered that a method of supplying a slurry to a wafer between upper and lower turn tables in double-side polishing is correlated with outer peripheral sag which occurs in a processing target wafer.

Furthermore, the present inventors has revealed that, by supplying a slurry in such a manner that an amount of the slurry supplied from slurry supply holes provided on an outer side relative to the center of rotation of an upper turn table becomes larger than an amount of the slurry supplied from slurry supply holes provided on an inner side relative to the same, a polishing amount at an outer peripheral portion of the wafer can be adjusted to obtain the high-quality wafer in which sag at the outer peripheral portion thereof is suppressed and the slurry can be appropriately supplied to polish both surfaces of a wafer efficiently, and hence they have brought the present invention to completion.

An embodiment according to the present invention will now be specifically explained hereinafter with reference to the drawings.

First, FIG. 1 is a schematic explanatory drawing showing an example of a double-side polishing apparatus, which can be used when carrying out a double-side polishing method according to the present invention. This double-side polishing apparatus 1 includes a lower turn table 2 and an upper turn table 3 which are vertically provided to face each other, and polishing pads 4 are attached to opposed sides of the respective turn tables 2 and 3. Moreover, a plurality of slurry supply holes 5 and 5' from which a polishing slurry is supplied are provided in the upper turn table 3 on an inner side and an outer side relative to the center of rotation of the upper turn table 3. Additionally, a sun gear 6 is provided at a central part between the upper turn table 3 and the lower turn table 2, an internal gear 7 is provided at a rim portion, and a processing target wafer W is held in a holding hole of a carrier 8 and sandwiched between the upper turn table 3 and the lower turn table 2. It is to be noted that a planetary type double-side polishing apparatus is used in this example, but the present invention is not restricted to the planetary type, and an swinging type double-side polishing apparatus may be adopted, for example.

A supplying mechanism for a slurry will now be explained. The slurry supplied to a space between the upper and lower turn tables at the time of double-side polishing is stored in a slurry tank 9, and a slurry supply duct 10 through which the slurry is supplied is extended from this slurry tank 9. Further, this supply duct 10 diverges into two toward the supply holes 5 provided on the inner side relative to the center of rotation of the upper turn table 3 and the supply holes 5' provided on the outer side relative to the same. Valves 11 and 11' which are used to adjust flow volumes of the slurry are arranged in the diverging supply ducts, respectively. Each diverging supply duct 10 is coupled with three slurry supply tubes 13 with a powder ring 12 interposed, and the other end of each supply tube 13 is connected with each supply hole 5 or 5' in the upper turn table 3.

Therefore, when a flow volume of the slurry flowing through each diverging slurry supply duct 10 is changed by the valve 11 or 11', an amount of the slurry supplied from the supply holes 5' placed on the outer side can be adjusted to be larger than an amount of the slurry supplied from the supply holes 5 placed on the inner side.

As the valves 11 and 11' or the powder rings 12, a mechanism which can appropriately control a flow volume of the slurry or that which can divide and flow the slurry to each supply tube 13 without clogging can suffice, and these members are not restricted in particular.

Further, the supply duct 10 diverges first into two from the slurry tank 9 in this example, but it may diverge in accordance with the number of the supply holes 5 and 5' provided in the upper turn table 3, valves may be provided in the respective diverging supply ducts 10, and these ducts may be coupled with the supply tubes 13 to be connected with the supply holes so that supply amounts of the slurry can be individually adjusted in accordance with the respective supply holes, for example.

The double-side polishing apparatus which can be used in the present invention is not restricted to the above apparatus, and any apparatus can be adopted as long as it has a structure where the slurry can be supplied in such a manner that an amount of the slurry supplied from the slurry supply holes 5' provided on the outer side relative to the center of rotation of the upper turn table becomes larger than an amount of the slurry supplied from the slurry supply holes 5 provided on the inner side relative to the same.

A method of polishing both surfaces of a wafer W based on the double-side polishing method according to the present invention will now be explained in relation to an example where the double-side polishing apparatus 1 depicted in FIG. 1 is used.

First, the processing target wafer W is held in the carrier 8, and the carrier 8 is sandwiched between the upper turn table 3 and the lower turn table 2. Outer peripheral teeth of the carrier 8 mesh with respective tooth portions of the sun gear 6 and the internal gear 7, and the carrier 8 rotates around the sun gear 6 while rotating on its axis when the upper turn table 3 and the lower turn table 2 are rotated by a non-illustrated driving source. As a result, both surfaces of the wafer W held in the carrier 8 are simultaneously polished by the polishing pads 4 attached to the upper and lower turn tables 2 and 3. At the time of this polishing, the slurry is supplied from the supply holes 5 and 5'. It is to be noted that the present invention is not restricted to such a planetary type as explained above.

Supply of the slurry at the time of polishing will now be explained. In the double-side polishing apparatus 1 depicted in FIG. 1, the slurry stored in the slurry tank 9 is flowed through the supply duct 10 and divided into two directions. One is a flow path leading to the supply holes 5 provided on the inner side relative to the center of rotation of the upper turn table 3, and the other is a flow path leading to the supply holes 5' provided on the outer side. The valves 11 and 11' provided in the respective diverging supply ducts 10 are used to independently control flow volumes of the slurry flowing through the respective flow paths. Thereafter, the flow paths are further divided by the powder rings 12, and the slurry is supplied to the wafer W between the upper and lower turn tables 2 and 3 from the respective supply holes 5 and 5' via the respective supply tubes 13.

At this time, the flow volumes of the slurry flowing through the respective supply ducts 10 leading to the supply holes 5 and 5' on the inner and outer sides are adjusted by using the valves 11 and 11' in such a manner that an amount supplied to the space between the upper and lower turn tables 2 and 3 from the supply holes 5' provided on the outer side becomes larger than an amount supplied from the supply holes 5 provided on the inner side.

Although the same amounts of the slurry are supplied from the respective supply holes in the conventional example, it is good enough to supply a larger amount of the slurry from at least one of the supply holes 5' on the outer side than amounts supplied from the other supply holes so that the supply amount of the slurry from the supply holes 5' on the outer side becomes larger than the amount of the slurry supplied from the supply holes 5 on the inner side. The supply holes 5 and 5' on the inner and outer sides can be divided at, e.g., a position corresponding to ½ of a radius of the upper turn table 3.

As explained above, when supplying the slurry, it is good enough to, e.g., independently adjust the supply amount of the slurry to the supply holes 5 on the inner side of the upper turn table 3 and the supply amount of the slurry to the supply holes 5' on the outer side of the same so that a larger amount of the slurry can be supplied to the supply holes 5' on the outer side than that supplied to the supply holes 5 on the inner side, and a method of adjusting flow volumes of the slurry, flow paths, and others are not restricted in particular.

Both the surfaces of the wafer W are polished while supplying the slurry in this manner.

According to the double-side polishing method, a polishing amount at the outer peripheral portion of the processing target wafer can be adjusted, and the high-quality wafer in which outer peripheral sag of the wafer is suppressed can be obtained, thereby improving a production yield. Furthermore, when a rate of the amounts of the slurry supplied to the inner side and the outer side is changed, an amount of sag at the outer peripheral portion can be controlled so that double-side polishing can be performed to obtain the wafer having a desired shape. Therefore, the high-quality wafer without outer peripheral sag can be obtained, and productivity of the wafer can be improved.

At this time, it is good enough to increase the amount of the slurry supplied from the supply holes provided on the outer side of the upper turn table to be twice or more of the amount of the slurry supplied from the slurry supply holes provided on the inner side.

When double-side polishing is carried out in this manner, outer peripheral sag of the wafer can be further assuredly suppressed, and the good-quality wafer with less sag at the outer peripheral portion and a high degree of flatness can be obtained, thereby further improving a production efficiency.

Although the present invention will now be explained in more detail based on examples and comparative examples, the present invention is not restricted thereto.

(Examples 1 and 2, Comparative Examples 1 to 3) Supply amounts of a slurry from supply holes provided on an inner side and an outer side relative to the center of rotation of an upper turn table were individually set/adjusted and both surfaces of each sample wafer were polished by using the double-side polishing apparatus depicted in FIG. 1.

In regard to supply of the slurry, an amount fed from a slurry tank was set to 3.5 l/min, and five patterns of a rate of a total amount supplied from supply holes 5 provided on the inner side of the upper turn table and a total amount supplied from supply holes 5' provided on the outer side of the same, i.e., 3:1(Comparative Example 1), 2:1 (Comparative Example 2), 1:1 (Comparative Example 3), 1:2 (Example 1), and 1:3(Example 2) were prepared.

It is to be noted that a P-type highly-doped product having a diameter of 300 mm, an orientation <100>, and a resistivity of 0.01 Ωcm was prepared as each sample wafer.

A polyurethane foam was used for a polishing pad, and colloidal silica was used as the slurry.

Moreover, each sample wafer was held in a carrier and sandwiched between upper and lower turn tables, the upper and lower turn tables were rotated in opposite directions at a rotating speed of 35 rpm with a polishing pressure of 140 g/cm$^2$ while supplying the slurry, both surfaces of the sample wafer were polished in each of the five slurry supply scheme patterns, and a shape of the polished sample wafer was measured to obtain outer peripheral sag.

FIG. 2 (Comparative Example 1), FIG. 3 (Comparative Example 2), FIG. 4 (Comparative Example 3), FIG. 5 (Example 1), FIG. 6 (Example 2), and FIG. 7 show measurement results of Examples 1 and 2 and Comparative Examples 1 to 3.

FIGS. 2 to 6 show shapes of polished sample wafers (contour maps and cross-sectional shapes). Additionally, FIG. 7 shows an outer peripheral sag amount in each example in the form of a graph, and a relationship between a slurry supply rate from the inner and outer supply holes provided in the upper turn table and the outer peripheral sag amount.

It can be confirmed from these drawings that large outer peripheral sag occurred in the sample wafer in each comparative example. On the other hand, it can be understood in each of Examples 1 and 2 that sag at the outer peripheral portion can be hardly observed and the outer peripheral sag is greatly suppressed as compared with each comparative example. Carrying out the double-side polishing method according to the present invention in this manner enables obtaining the high-quality wafer in which sag at the outer peripheral portion is suppressed.

Further, although the supply total amounts of the slurry are equal in the respective examples, it can be understood that changing a supply rate from the inner and outer supply holes of the upper turn table enables varying the outer peripheral sag amount and controlling the outer peripheral sag amount of the wafer subjected to double-side polishing in accordance with each purpose.

It is to be noted that the present invention is not restricted to the foregoing embodiment. The foregoing embodiment is just an example, and any embodiment having substantially the same structure and the same functions and effects as those in the technical concept explained in claims of the present invention is included in the technical scope of the present invention.

The invention claimed is:

1. A double-side polishing method for polishing a wafer, the method comprising:
    sandwiching the wafer held in a carrier between upper and lower turn tables, wherein each of the upper and lower turn tables has an attached polishing pad;
    simultaneously polishing both surfaces of the wafer while supplying a slurry to a space between the upper and lower turn tables from a plurality of slurry supply holes provided in the upper turn table;
    adjusting a polishing amount at an outer peripheral portion of the wafer; and
    suppressing an outer peripheral sag of the wafer by supplying the slurry such that an amount of the slurry supplied from the slurry supply holes provided on an outer side relative to a center of rotation of the upper turn table becomes larger than twice or more of an amount of the slurry supplied from the slurry supply holes provided on an inner side relative to the center of rotation of the upper turn table at a time of polishing both of the surfaces of the wafer.

\* \* \* \* \*